US 6,528,881 B1

(12) United States Patent
Tsuboi

(10) Patent No.: US 6,528,881 B1
(45) Date of Patent: Mar. 4, 2003

(54) SEMICONDUCTOR DEVICE UTILIZING A SIDE WALL TO PREVENT DETERIORATION BETWEEN ELECTRODE PAD AND BARRIER LAYER

(75) Inventor: Atsushi Tsuboi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/640,179

(22) Filed: Aug. 17, 2000

(30) Foreign Application Priority Data

Aug. 27, 1999 (JP) .......................... 11-242035

(51) Int. Cl.[7] .............................................. H01L 23/48
(52) U.S. Cl. ...................... 257/738; 257/751; 257/764; 257/778; 257/779; 257/781; 28/180.22
(58) Field of Search .................. 438/611, 612, 438/613, 614, 106, 108; 257/741, 748, 763, 764, 780, 781, 737, 738, 751, 734, 778, 779; 228/180.22; 29/840, 843

(56) References Cited

U.S. PATENT DOCUMENTS 5,136,364 A * 8/1992 Byrne ....................... 257/751
6,107,170 A * 8/2000 Sathe et al. ................. 438/583
6,133,136 A * 10/2000 Edelstein et al. ........... 438/618
6,187,680 B1 * 2/2001 Costrini et al. ............. 438/688
2002/0003302 A1 1/2002 Watanabe et al. ........... 257/754

FOREIGN PATENT DOCUMENTS

| JP | 57-90963 | * | 6/1982 |
| JP | 6-21218 | * | 1/1994 |
| JP | 7-297149 | * | 11/1995 |
| JP | 8-45939 | | 2/1996 |
| JP | 9-199505 | | 7/1997 |
| JP | 10-261642 | | 9/1998 |
| JP | 11-186308 | | 7/1999 |
| JP | 2000-299337 | | 10/2000 |

* cited by examiner

Primary Examiner—Albert W. Paladini
Assistant Examiner—Alonzo Chambliss
(74) Attorney, Agent, or Firm—Young & Thompson

(57) ABSTRACT

In a semiconductor device that includes a barrier film, an electrode pad on the barrier film, and a solder ball on the electrode pad, the electrode pad is prevented from exfoliating from the barrier film by a side wall film separating the solder ball from a boundary between the barrier film and the electrode pad.

15 Claims, 11 Drawing Sheets

SEMICONDUCTOR DEVICE UTILIZING A SIDE WALL TO PREVENT DETERIORATION BETWEEN ELECTRODE PAD AND BARRIER LAYER

BACKGROUND OF THE INVENTION

1. Field of the Invention

The present invention relates to a semiconductor device and a method for manufacturing the same, and more particularly to a semiconductor device having a solder ball formed on an electrode pad and a method for manufacturing the same semiconductor device.

2. Description of the Related Art

In recent years, the miniaturization in size and reduction in cost of electronic appliances such as mobile telephones and notebook-sized personal computers have advanced, and a semiconductor device such as a large-scale integrated circuit and the like (hereinafter referred to as an LSI) to be built in these electronic appliances is required to be more miniaturized in size and more reduced in cost.

In order to meet such a demand as described above, a flip chip ball grid array (FCBGA) method has appeared which fixes solder balls on a plurality of electrode pads on an LSI, connects the solder balls directly to the corresponding electrodes of a wiring board and thereby joins the LSI electrically and mechanically to the wiring board. In an LSI using this method, the surface layer of an electrode pad is formed out of copper (Cu) in order to improve the affinity of a solder ball for the electrode pad and make the connectivity better.

A conventional semiconductor device using an FCBGA method is disclosed in Japanese Patent Laid-Open Publication No. Hei 10-261,642. FIG. 19 is a magnified sectional view showing a solder ball forming portion of a semiconductor device described in this reference.

This semiconductor device comprises a bonding pad 41 formed on a semiconductor substrate 31, a passivation film 33 formed around the bonding pad 41, a barrier film 38 formed on the passivation film 33 and the bonding pad 41, an electrode pad 39 formed on the barrier film 38 in the same flat shape as the barrier film 38, and a solder ball 34 fixed on the electrode pad 39. The barrier film 38 is formed out of Ti, TiW, Cr or TiN, and the electrode pad 39 is formed out of Cu for the above-mentioned reason.

In such a conventional semiconductor device manufacturing method as described above, since a solder ball 34 stops at the outer edge portion of a barrier film 38 as covering the whole of an electrode pad 39 when it is reflowed and is fixed on the electrode pad 39 nearly in the shape of a sphere due to its surface tension, the solder ball 34 is brought into contact with the outer edge portions of both the electrode pad 39 and the barrier film 38. Namely, since solder is good in wettability with Cu and is poor in wettability with Ti (titanium), solder goes around onto the side surface of the electrode pad 39 made of Cu and stops going around at the boundary between the electrode pad 39 made of Cu and the barrier film 38 made of Ti.

Due to heating for the solder reflow, as shown in FIG. 20, tin (Sn) atoms 43 thermally diffuse and move from the interface between the solder ball 34 and the electrode pad 39 into the electrode pad 39. The inventors have found that at this time, since the quantity of movement of Sn atoms 43 in the interface between the electrode pad 39 and the barrier film 38 is larger than the quantity of movement of them in the interface between the solder ball 34 and the electrode pad 39, the Sn atoms 43 have moved to a considerably deep interior from the side surface of the electrode pad 39.

And when patterning the electrode pad 39 by means of etching and the like, its outer edge portion is sometimes not vertical, but is slanted. As shown by a dashed line in FIG. 20, which is a magnified view of a joint portion of FIG. 19, when the outer edge portion of the electrode pad 39 is formed in a tapered shape, Sn atoms 43 of an Sn component thermally diffuse from the tapered portion of the electrode pad 39 and the Sn atoms 43 easily reach the boundary between the electrode pad 39 and the barrier film 38.

For such a reason as described above, the inventors have found also that Sn atoms 43 existing in the interface between the electrode pad 39 and the barrier film 38 degrade the adhesion of the electrode pad 39 to the barrier film 38.

Generally, a solder ball is fixed on a wiring board (not illustrated) by being reflowed at a temperature of 355 to 365 C. At this time, a strain is generated by the difference in thermal expansion coefficient between a semiconductor chip including a semiconductor substrate and a wiring board. At this time, when there is said degradation in adhesion, as shown in FIG. 20, exfoliation 42 occurs at the interface between the electrode pad 39 and the barrier film 38. The exfoliation 42 triggers exfoliation of the solder ball 34 to cause a continuity failure, or triggers the increase of electric resistance to cause degradation in the manufacturing yield rate.

SUMMARY OF THE INVENTION

In consideration of the above, an object of the present invention is to provide a semiconductor device and a method for manufacturing the same which can prevent an electrode pad from exfoliating from a barrier film, improve the manufacturing yield rate, and improve the reliability of connection of a semiconductor device with a wiring board even if a strain caused by the difference in thermal expansion coefficient between the semiconductor device and the wiring board acts on a solder ball.

In order to attain the above object, according to a first aspect of the present invention, there is provided a semiconductor device comprising a barrier film, an electrode pad directly contacting the barrier film, a solder ball directly contacting the electrode pad, and a side wall film separating the solder ball from a boundary between the barrier film and the electrode pad.

According to a second aspect of the present invention, there is provided a semiconductor device comprising a wiring layer, an insulating layer on the wiring layer, an opening formed in the insulating layer to expose an upper surface of the wiring layer, a barrier film formed on an inner surface of the opening and on the insulating; an electrode pad formed on the barrier film, a side wall film formed on a side surface of the barrier film and a side surface of the electrode pad covering a boundary between the barrier film and the electrode pad, and a solder ball formed on the electrode pad.

According to a third aspect of the present invention, there is provided a method of manufacturing a semiconductor device comprising the steps of forming an insulating layer on a wiring layer, forming an opening in the insulating layer, the opening exposing an upper surface of the wiring layer, forming a first conductive film on an inner surface of the opening and on the insulating layer, forming a second conductive film on the first conductive film, patterning the first and second conductive films to form a barrier film on the wiring layer and an electrode pad on the barrier film, forming a side wall film covering a boundary between the barrier film and the electrode pad on patterned edges of the barrier film and the electrode pad, and forming a solder ball on the electrode pad.

According to the present invention, based on the above constitution, since the solder ball does not contact the boundary between the electrode pad and the barrier film, it is possible to prevent a component of the solder ball from diffusing into an interface of the electrode pad and the barrier film. Therefore, it is possible to prevent the electrode pad from exfoliating from the barrier film.

BRIEF DESCRIPTION OF THE DRAWINGS

The above and other objects, features, and advantages of the present invention will become more apparent from the following detailed description when taken in conjunction with the accompanying drawings wherein.

DETAILED DESCRIPTION OF THE PREFERRED EMBODIMENTS

Figure 1:
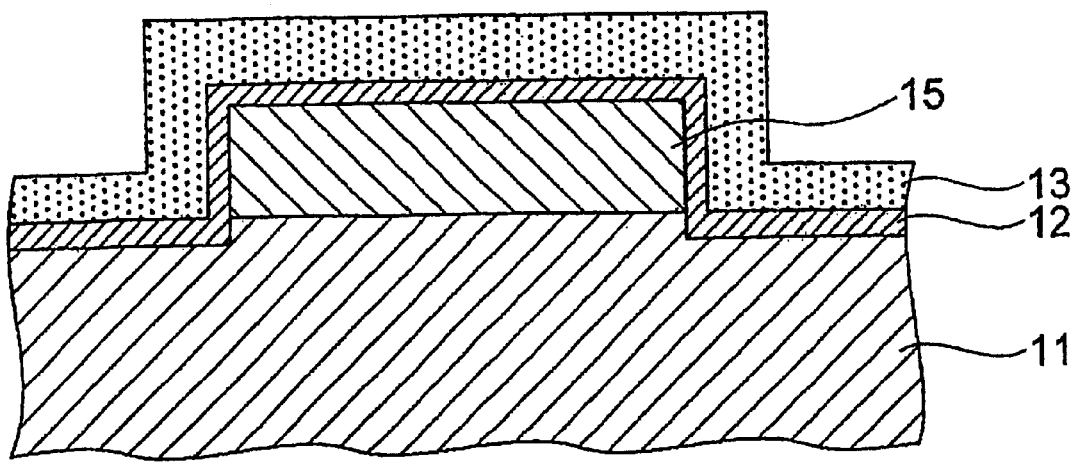
FIG. 1 is a sectional view showing in order the processes of manufacturing a semiconductor device in a first embodiment of the present invention.
Figure 19:
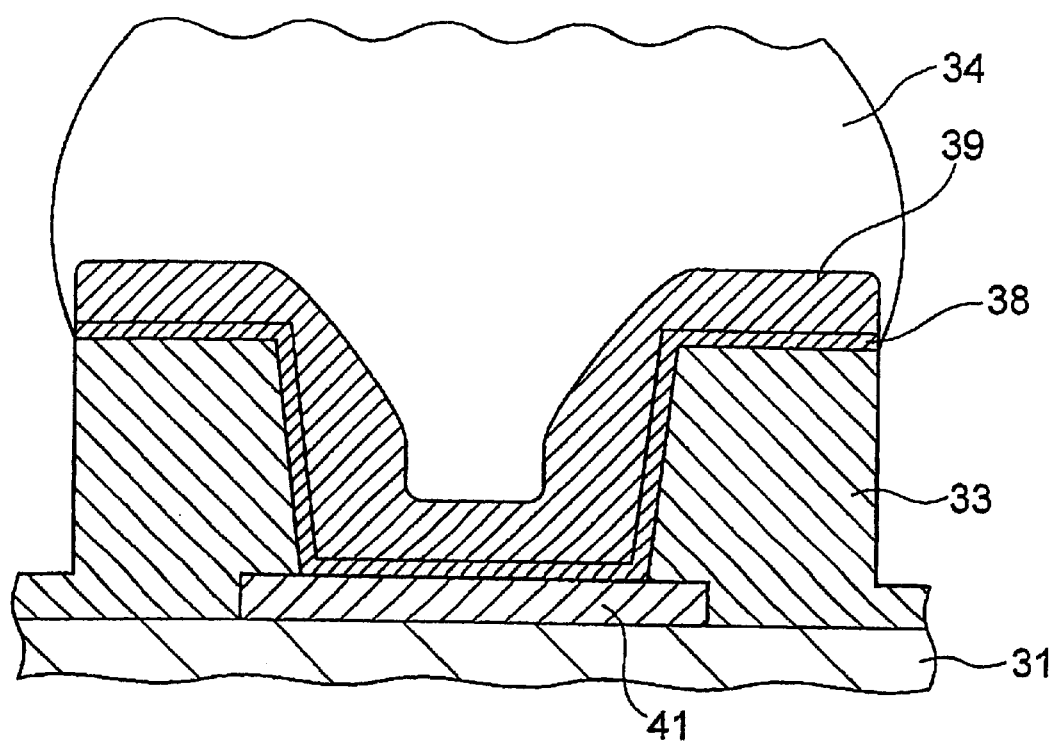
FIG. 19 is a sectional view showing a solder ball forming portion of a conventional semiconductor device.
Figure 20:
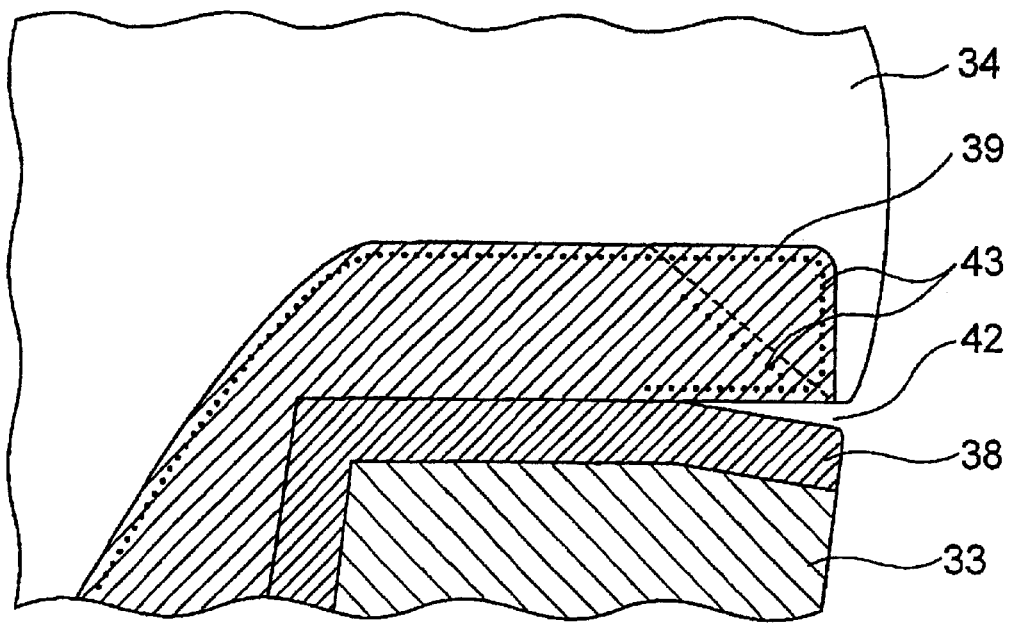
FIG. 20 is a magnified sectional view showing exfoliation occurring in the solder ball forming portion in FIG. 19.

As shown in FIG. 1, an aluminum layer 15 is formed on an insulating film 11 formed on a semiconductor substrate and therefrom a metal wiring layer 15 having a specified pattern is formed by an etching process using a photolithography method, and then a photo resist film (not illustrated) is removed. The metal wiring layer 15 can be formed out of copper (Cu) or an Al-Cu alloy in addition to Al. The metal wiring layer 15, which is equivalent to a bonding pad of the prior art (FIG. 19), is connected to an element such as a transistor and the like (not illustrated) forming a semiconductor device and functions as a relay terminal to be connected with a circuit (not illustrated) outside the semiconductor device.

Next, an $SiO_2$ film 12 of 0.12 $\mu$m in thickness and an SiON film 13 of 1 $\mu$m in thickness are formed in this order by means of a chemical vapor deposition (CVD) method. Here, the SiO2 film 12 and the SiON film 13 function as a passivation film. Particularly, the SiON film 13 effectively hinders invasion of moisture.

Figure 2:
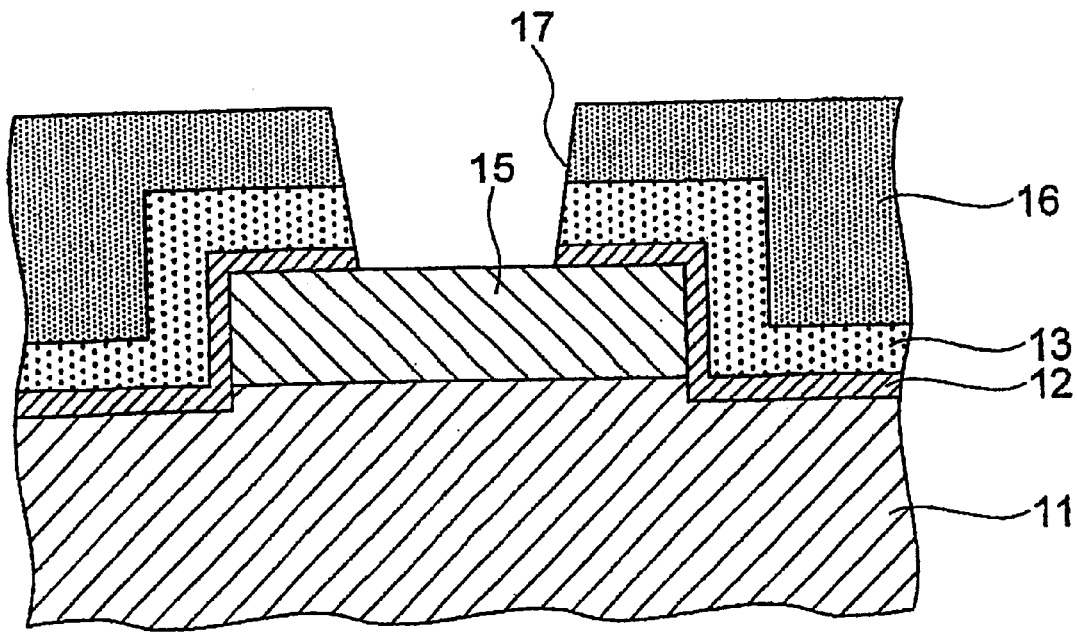
FIG. 2 is a sectional view showing in order the processes of manufacturing the semiconductor device in the first embodiment.

After this, as shown in FIG. 2, a polyimide film is formed to 10 $\mu$m in thickness on the SiON film 13 and then the polyimide film 16, the SiON film 13 and the $SiO_2$ film 12 are in order etched to form an opening 17 and expose the surface of a metal wiring 15. Next, the polyimide film is baked for 30 minutes at a certain temperature. Here, it is desired that the baking temperature is equal to or higher than a temperature (365° C.) at which a high-melting point solder of a solder ball melts and is equal to or lower than a temperature (400° C.) at which a semiconductor device is damaged. Here, the polyimide film 16 functions as a passivation film and a buffer to a resin.

Figure 3:
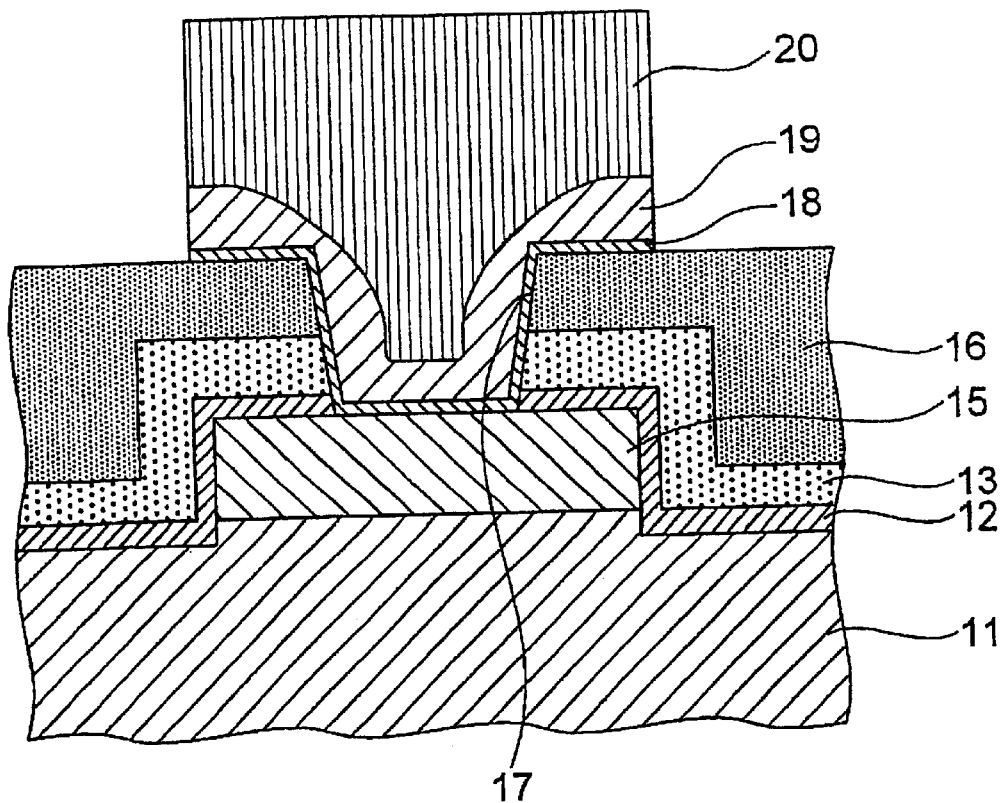
FIG. 3 is a sectional view showing in order the processes of manufacturing the semiconductor device in the first embodiment.

Next, as shown in FIG. 3, a barrier film 18 of 0.2 $\mu$m in thickness formed out of tungsten-titanium (TiW) is formed over the inside of the opening 17 and the polyimide film 16 by sputtering, and then an electrode pad 19 of 3 $\mu$m in thickness formed out of Cu is formed on the barrier film 18 by sputtering. Following this, a photoresist film 20 is formed to 2.3 $\mu$m in thickness as a mask on the barrier film 18 and the electrode pad 19.

Next, a part of the electrode pad 19 projecting from the edge of the photoresist film 20 is etched away by means of an etching solution containing $H_2SO_4$, $H_2O$ and $H_2O$ at a ratio of "1:1:2". Further, a part of the barrier film 18 projecting from the edge of the photoresist film 20 is etched away by means of an etching solution containing $H_2O$ and $H_2O$ at a ratio of "1:2", and thereafter the photoresist film 20 is removed.

Figure 4:
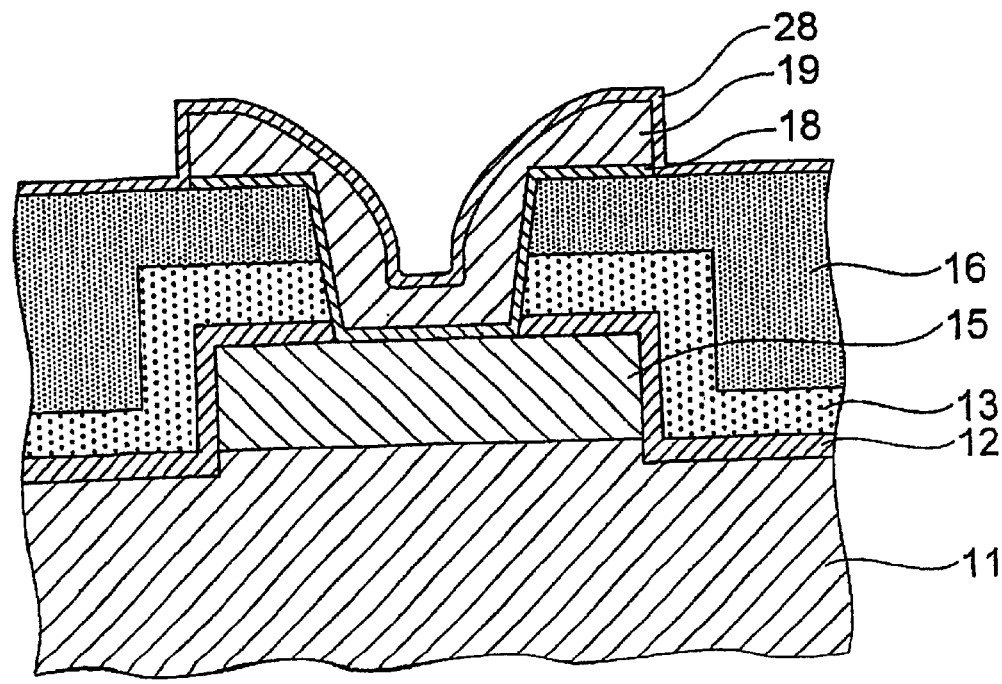
FIG. 4 is a sectional view showing in order the processes of manufacturing the semiconductor device in the first embodiment.
Figure 5:
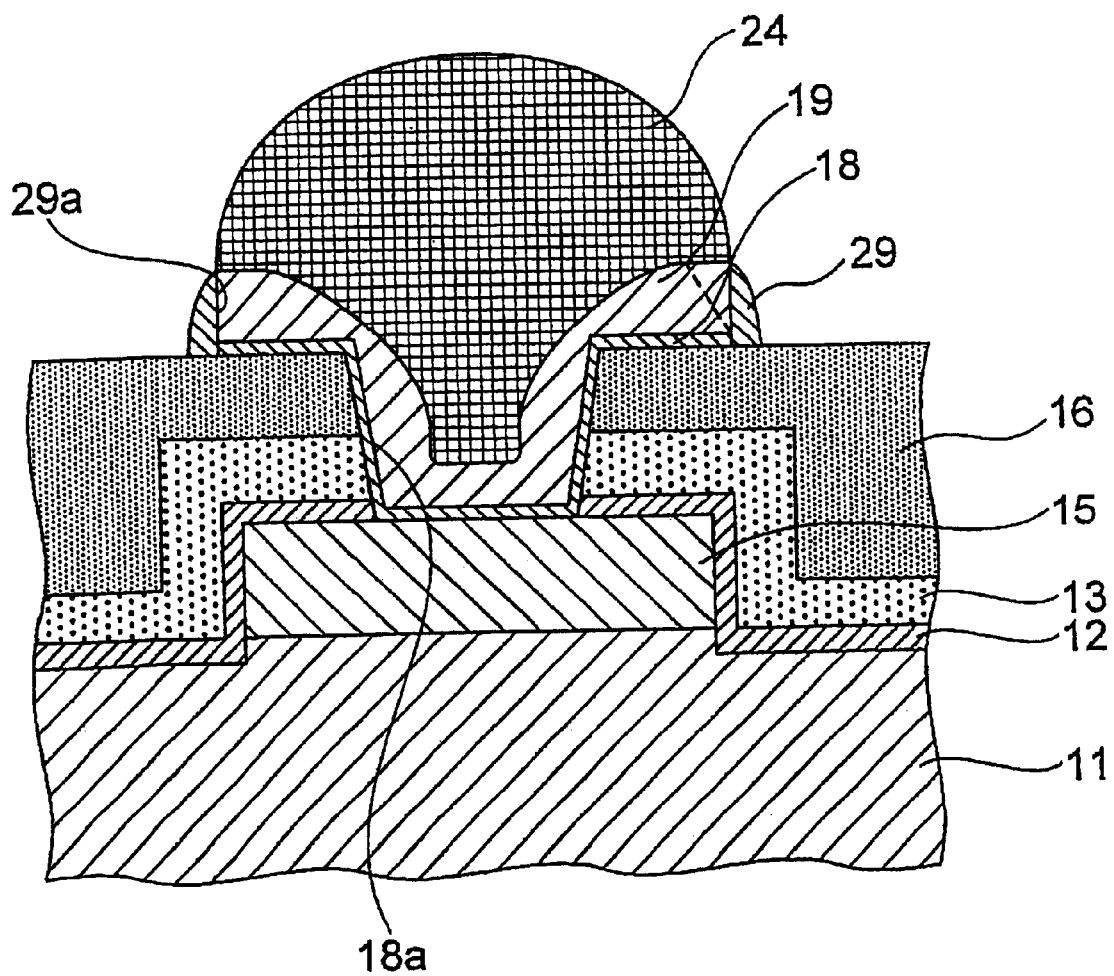
FIG. 5 is a sectional view showing in order the processes of manufacturing the semiconductor device in the first embodiment.

After this, as shown in FIG. 4, a TiW film 28 is formed to 0.2 $\mu$m in thickness on the exposed electrode pad 19 by sputtering and the TiW film other than the sidewall portion is removed by an isotropic etching process. By this, the upper face of the electrode pad 19 is exposed and the remaining part of the TiW film 28 makes a sidewall 29 enclosing the outer circumferential face of the electrode pad 19 (FIG. 5). In this case, since the sidewall 29 is made of a TiW film, the adhesion of the end portion of the barrier film 18 formed out of TiW to the sidewall 29 is improved.

Next, electric characteristics of a plurality of LSIs described above which are arranged on a single wafer is tested by a die sorting test using an IC testing apparatus and after the test has ended, each LSI chip is cut out to be a semiconductor chip.

Moreover, as shown in FIG. 5, a solder ball 24 formed out of a high-melting point solder of Pb-Sn is melted and adhered onto the electrode pad 19 of each LSI cut out, and is reflowed for 10 to 20 minutes at a temperature of 340 to 365° C. At the time of this reflow, since the high-melting point solder of Pb-Sn has no wettability with TiW, it does not go around onto the outer circumferential face of the electrode pad 19 enclosed by the sidewall 29. Therefore, while the diffusion of Sn to the boundary between the electrode pad 19 and the barrier film 18 is suppressed, a solder ball 24 is formed to a size of 150 $\mu$m in diameter by surface tension on the electrode pad 19. In FIG. 5, symbol 29a is the outer circumferential face of the electrode pad 29 and symbol 18a is the inner wall of the barrier film 18.

Next, an LSI having a solder ball 24 fixed on each electrode pad 19 is mounted on a wiring board (not illustrated). Further, a resin material is injected and hardened between the LSI and the wiring board, and then a heat sink (not illustrated) is attached according to need, or external terminal balls (not illustrated) are formed on the reverse face of the wiring board.

Figure 6:
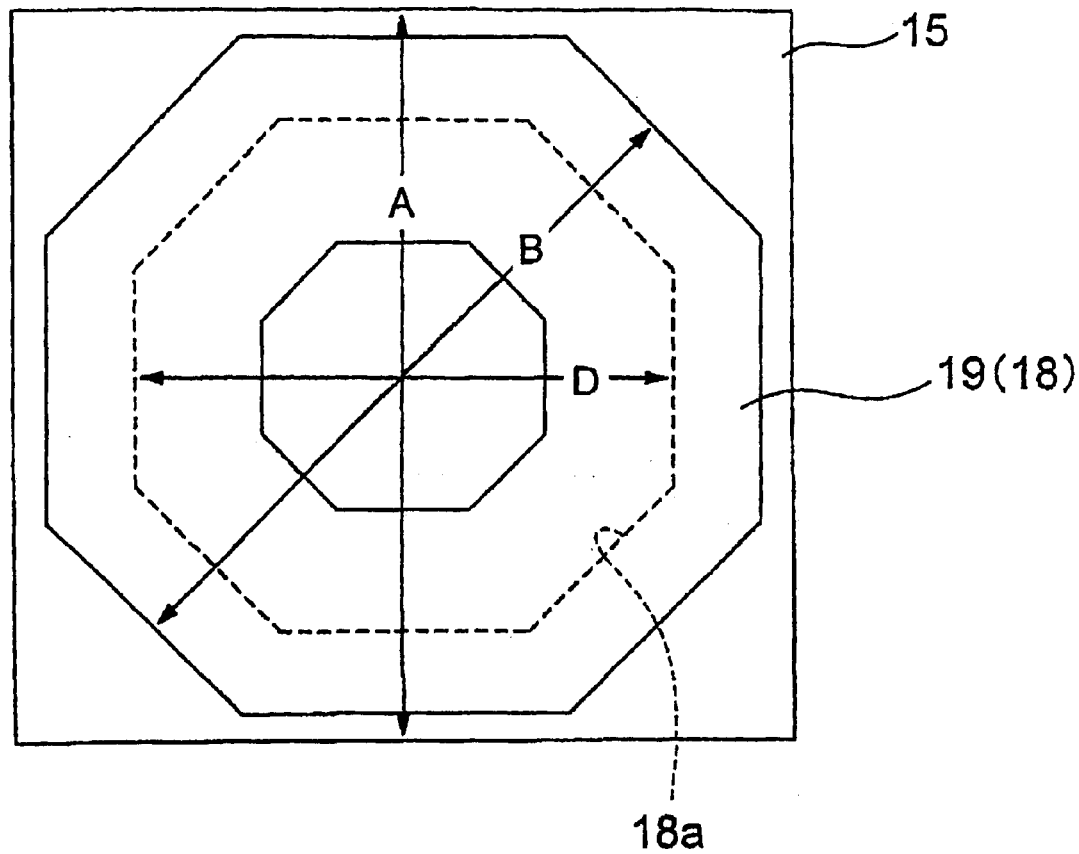
FIG. 6 is a plan view of the semiconductor device of the first embodiment.

FIG. 6 is a plan view schematically showing the semiconductor device shown in FIG. 4, and magnifies and illustrates a solder ball forming portion in particular. The metal wiring layer 15 is set at 140±10 $\mu$m in width A. The electrode pad 19 (barrier film 18) is formed in the shape of a regular octagon, and the distance B between two sides (29a in FIG. 5) opposite to each other is set at 135±10 $\mu$m. The opening 17 (FIG. 3) is formed in the shape of a regular octagon and the distance D between the inner walls (18a in FIG. 5) of the barrier 18 opposite to each other is set at 90±10 $\mu$m.

Here, the distance B is properly determined according to the size of a solder ball, and the distance D is properly determined according to the holding strength of the solder ball. And the distance A is set so as to be at least larger than the distance D by an allowable error in consideration of the accuracy of aligning the opening 17 with the electrode pad 19 in an LSI manufacturing process.

And the shape of the electrode pad 19 and the opening 17 is not limited to a regular octagon but may be such a shape as a regular polygon or a circle which can prevent solder from coming to be liable to exfoliate due to concentration of a stress at a corner of a polygon.

According to this embodiment, since a high-melting point solder of Pb-Sn does not go around to the end portion of the boundary between the electrode pad 19 and the barrier film 18 thanks to the presence of the sidewall 29 and it is possible to prevent a phenomenon that the Sn component of the solder ball 24 diffuses from the end portion of the boundary between the electrode pad 19 and the barrier film 18, it is possible to prevent the adhesion of the electrode pad 19 to the barrier film 18 from being lowered. Thanks to this, even in case that a stress strain caused by the difference in thermal expansion coefficient between semiconductor chip and a wiring board occurs when mounting the semiconductor chip on the wiring board, it is possible to securely prevent the electrode pad 19 from being exfoliated from the barrier film 18.

Further, it is possible to improve the manufacturing yield rate and enhance the reliability of connection of the semiconductor device to the wiring board. And since the diffusion of an Sn component can be suppressed by a simple composition of forming a sidewall 29 around an electrode pad 19, it is possible to sufficiently cope with miniaturization of a wiring board, a semiconductor chip and a solder ball electrode. Further, even in case that the outer edge part of an electrode pad 19 is formed in a tapered shape as shown by a dashed line of FIG. 5, since the tapered portion of the electrode pad 19 is covered with a sidewall 29, it is possible to prevent a disadvantage that an Sn component diffuses from the upper face of the tapered portion to reach the above-mentioned boundary.

Figure 7:
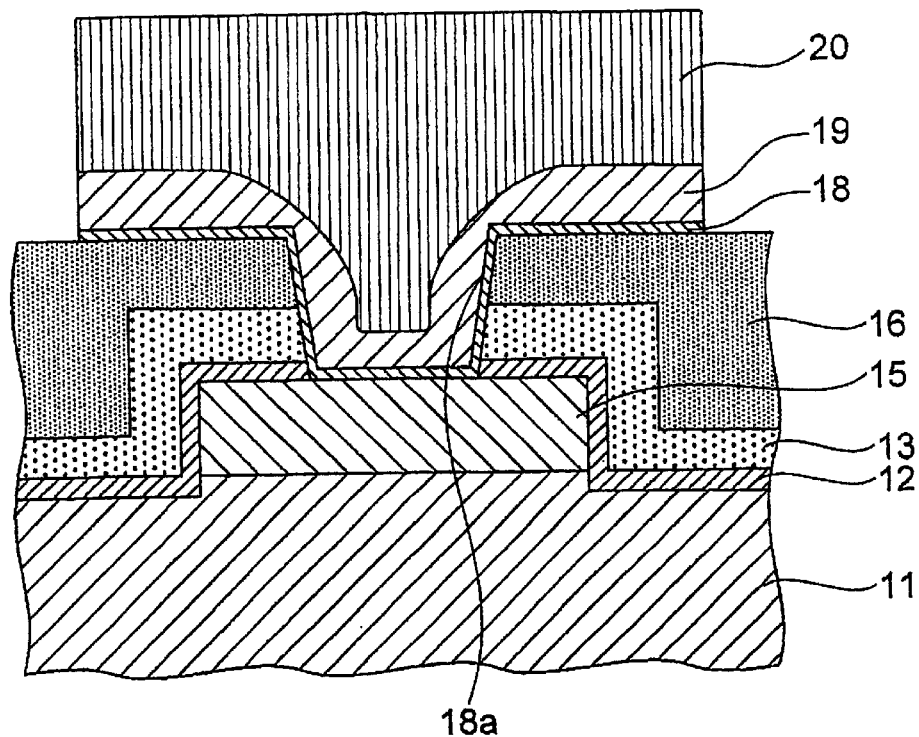
FIG. 7 is a sectional view showing in order the processes of manufacturing a semiconductor device in a second embodiment of the present invention.
Figure 8:
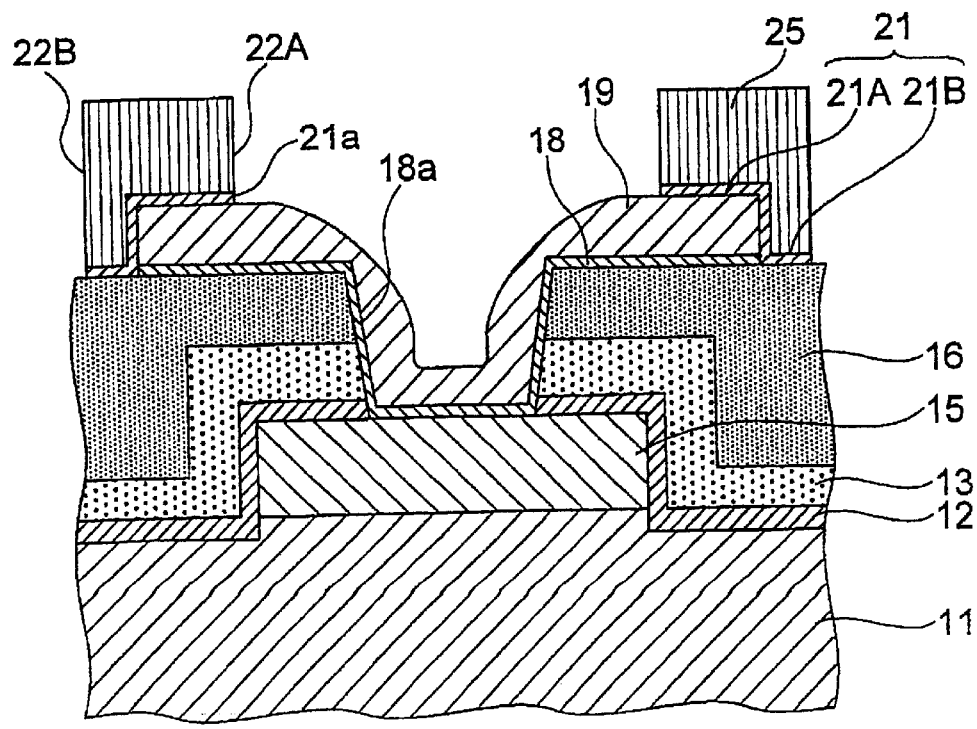
FIG. 8 is sectional view showing in order the processes of manufacturing the semiconductor device in the second embodiment.
Figure 9:
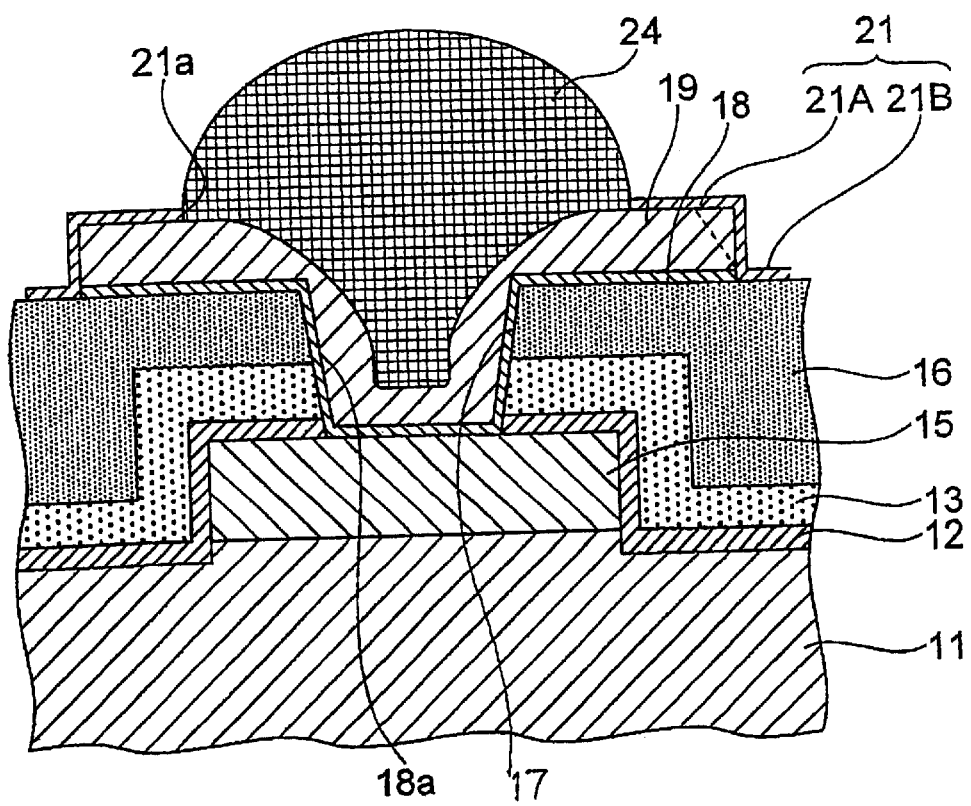
FIG. 9 is a sectional view showing in order the processes of manufacturing the semiconductor device in the second embodiment.

FIGS. 7 to 9 are sectional views showing in order the processes for manufacturing a semiconductor device having an FCBGA in a second embodiment of the present invention, in which a solder ball forming portion is illustrated being magnified in particular. Since this embodiment has the same processes as FIGS. 1 and 2 in the first embodiment, the processes after these processes are described.

After the process described in FIG. 2, as shown in FIG. 7, a barrier film 18 of 0.2 $\mu$m in thickness formed out of TiW is formed over the inside of the opening 17 and the polyimide film 16 by sputtering, and then an electrode pad 19 formed out of Cu is formed to 3 $\mu$m in thickness on the barrier film 18 by sputtering. Following this, a photoresist film 20 is formed to 2.3 $\mu$m in thickness on the barrier film 18 and the electrode pad 19.

Further, a part of the electrode pad 19 projecting from the edge of the photoresist film 20 is etched away by means of an etching solution containing $H_2SO_4$, $H_2O_2$ and $H_2O$ at a ratio of "1:1:2". After this, a part of the barrier film 18 projecting from the edge of the photoresist film 20 is etched away by means of an etching solution containing $H_2O_2$ and $H_2O$ at a ratio of "1:2", and thereafter the photoresist film 20 is removed.

In this embodiment, the barrier film 18, the electrode pad 19 and the photoresist 20 are made larger than the size of a plane shape common to each layer in FIG. 3 of the first embodiment.

After this, as shown in FIG. 8, a TiW film 21 is formed to 0.2 $\mu$m in thickness all over the surface of a wafer having the exposed electrode pads 19 by sputtering and a photoresist film is formed to 2.3 $\mu$m in thickness as a mask on the TiW film 21 and further is exposed and developed, and thereafter the upper portion of the TiW film 21 is removed by wet-etching the inside of an opening 22A and the peripheral area 22B of the electrode pad 19. After this, the photoresist film 25 is removed.

By this, an opening 21a is formed in the TiW film 21 and the upper face of the electrode pad 19 is exposed, and the remaining portion of the TiW film 21 makes a sidewall covering the outer edge portion of the electrode pad 19 and its vicinity. The TiW film 21 forms a step out of the upper face 21A of the electrode pad 19, the side face and the lower part 21B over the polyimide film 16.

Next, electric characteristics of a plurality of LSIs arranged on a single wafer are tested by a die sorting test and after the test has ended, each LSI chip is cut out to be a semiconductor chip.

Moreover, as shown in FIG. 9, a solder ball 24 formed out of a high-melting point solder of Pb-Sn is melted and adhered onto the electrode pad 19 in the opening 21a of each LSI cut out, and is reflowed for 10 minutes at a temperature of 340 to 365° C. At the time of this reflow, since the high-melting point solder of Pb-Sn has no wettability with the TiW film 21, it does not go around onto the outer circumferential face of the electrode pad 19 enclosed by the sidewall(21). Therefore, while the diffusion of Sn to the end part of the boundary between the electrode pad 19 and the barrier film 18 is suppressed by the sidewall(21) covering the outer edge portion of the electrode pad 19 and its vicinity, a solder ball 24 is formed to a size of 150 μm in diameter by surface tension on the electrode pad 19.

Figure 10:
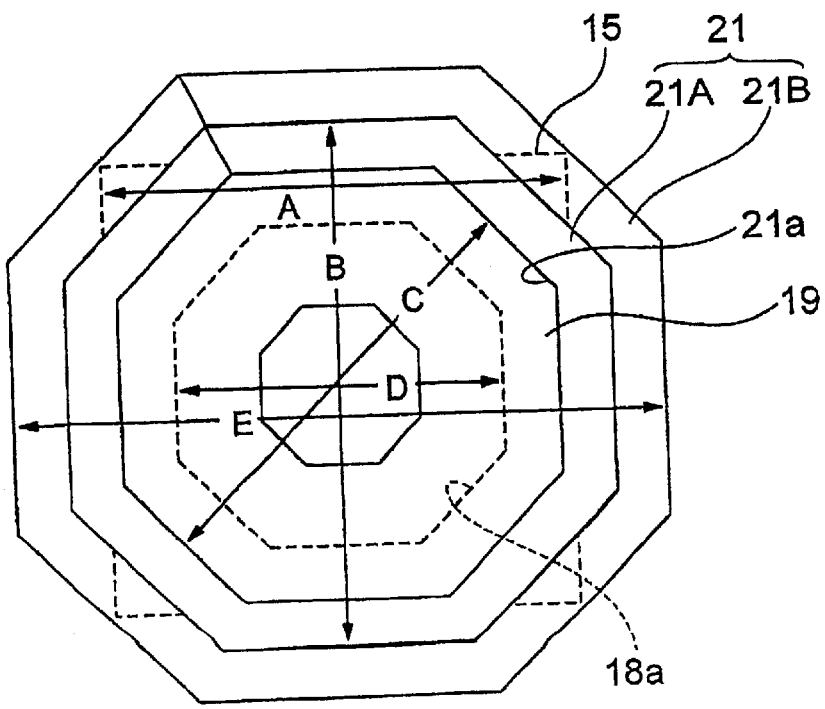
FIG. 10 is plan view of the semiconductor device in the second embodiment.

FIG. 10 is a plan view schematically showing the semiconductor device shown in FIG. 8, in which a solder ball forming portion is illustrated being magnified in particular. This LSI has in order from the most outer circumference a TiW film 21 being in the shape of a regular octagon having a step shape, a metal wiring layer 15 and an electrode pad 19 in the shape of a regular octagon. The metal wiring layer 15 is set at 140–10 μm in width A, the distance B between two sides opposite to each other of the upper part 21A is set at 155±10 μm, the distance C between two sides opposite to each other of the opening 21a is set at 135±10 μm, the distance D between two sides opposite to each other of the opening 18a is set at 90±10 μm, and the distance E between two sides opposite to each other of the lower part 21B is set at 165±10 μm.

Here, the distance C is properly determined according to the size of a solder ball, and the distance D is properly determined according to the holding strength of the solder ball. And the distance A is set so as to be at least larger than the distance D by an allowable error in consideration of the accuracy of aligning the opening 17 with the electrode pad 19 in an LSI manufacturing process (FIG. 9). Similarly, the distances B and E are set so as to be at least larger than the distance D by an allowable error so that the end face of the electrode pad 19 is securely covered with the barrier film 21 in consideration of the accuracy of aligning the opening 17 with the electrode pad 19 in an LSI manufacturing process. And the shape of the electrode pad 19, the opening 17 and the barrier film 21 is not limited to a regular octagon but may be such a shape as a regular polygon or a circle which can prevent a solder ball from coming to be liable to exfoliate due to concentration of a stress at a corner of a polygon.

According to this embodiment, a high-melting point solder of Pb-Sn does not go around onto the end part of the boundary between the electrode pad 19 and the barrier film 18 thanks to the presence of the sidewall (21) having the opening 21a, and the Sn component of the solder ball 24 comes not to diffuse to the end part of the boundary between the electrode pad 19 and the barrier film 18, and therefore it is possible to obtain the same action and effect as the first embodiment.

And in this embodiment, even in case that for example a range of 5 to 10 (7) μm of the outer edge portion of an electrode pad 19 is formed in a tapered shape as shown by a dashed line of FIG. 9, since the outer edge portion of the electrode pad 19 and its vicinity can be completely covered with a TiW film 21, it is possible to prevent a phenomenon that an Sn component diffuses from the tapered portion and reaches the above-mentioned boundary.

FIGS. 11 to 17 are sectional views showing in order the processes for manufacturing a semiconductor device having an FCBGA in a third embodiment of the present invention, in which a solder ball forming portion is illustrated being magnified in particular.

Figure 11:
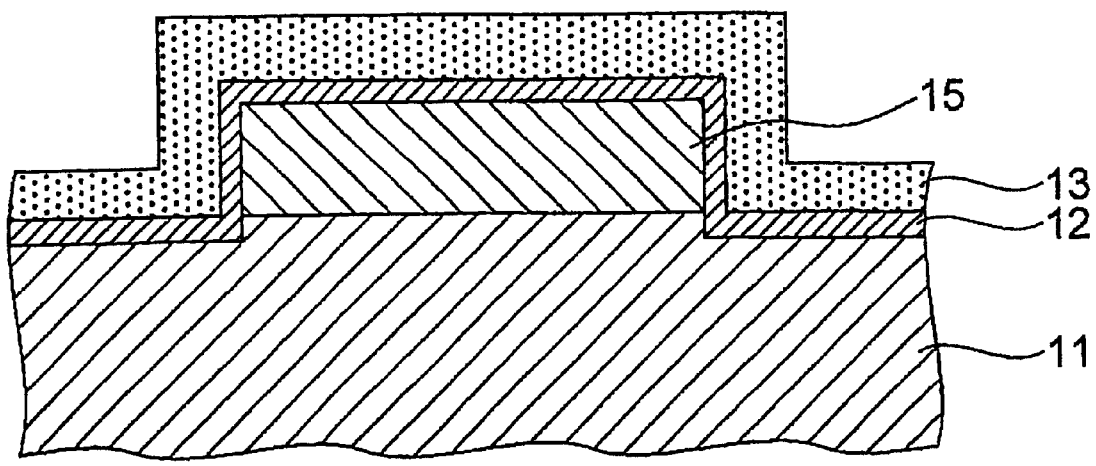
FIG. 11 is a sectional view showing in order the processes of manufacturing a semiconductor device in a third embodiment of the present invention.

First, as shown in FIG. 11, an aluminum layer (15) is formed on an insulating film 11 formed on a semiconductor substrate and a metal wiring layer 15 is obtained by means of an etching process using a photolithography method, and then a photoresist film (not illustrated) is removed. Further, an SiO2 film 12 of 0.12 μm in thickness and an SiON film 13 of 1 μm in thickness are formed in this order by means of a CVD method.

Figure 12:
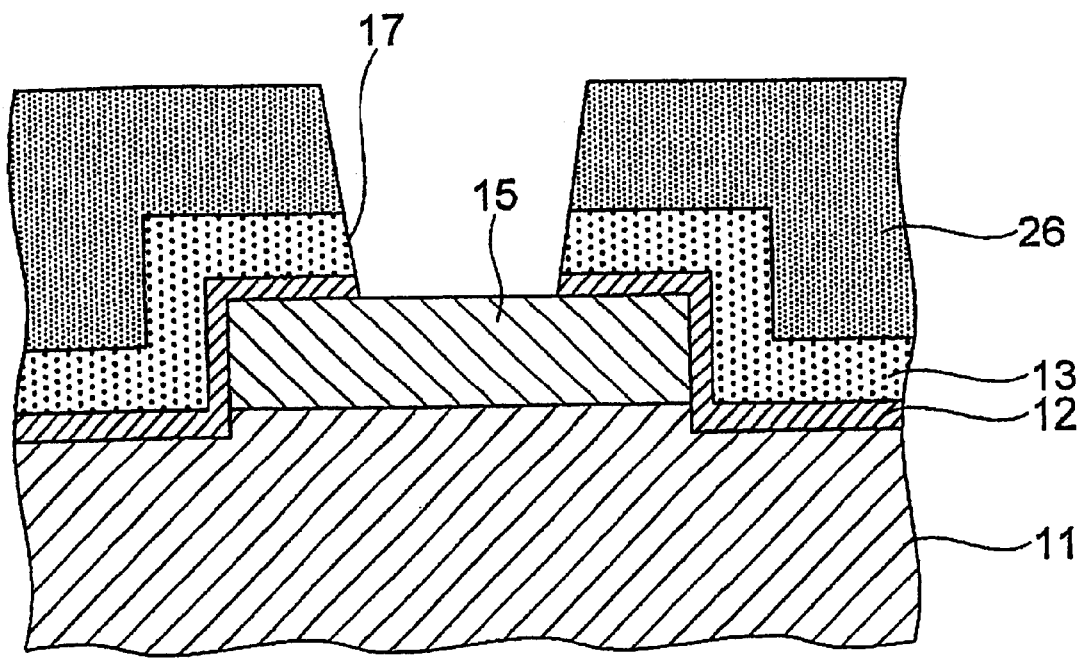
FIG. 12 is a sectional view showing in order the processes of manufacturing the semiconductor device in the third embodiment.

Next, as shown in FIG. 12, a photoresist film 26 is formed to 2.3 μm in thickness, and is exposed and developed and thereafter the metal wiring layer 15 is exposed to form an opening 17 by etching the SiON film 13 and the SiO2 film 12, and further the remaining photoresist film 26 is removed.

Figure 13:
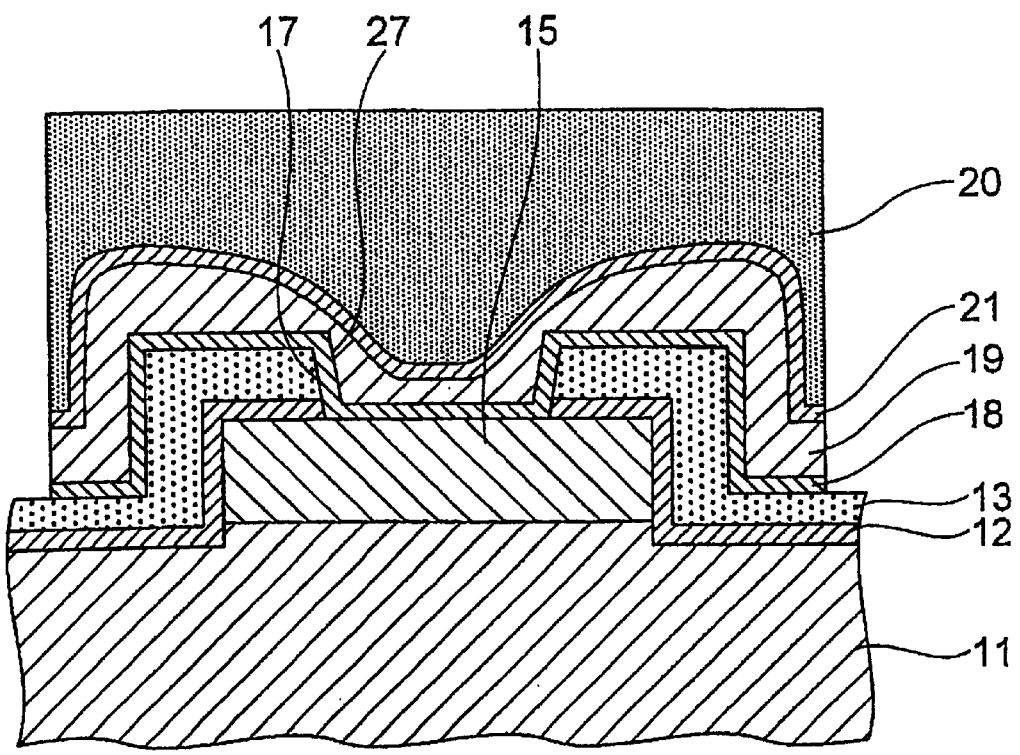
FIG. 13 is a sectional view showing in order the processes of manufacturing the semiconductor device in the third embodiment.

After this, as shown in FIG. 13, a barrier film 18 formed out of TiW of 0.2 μm in thickness is formed over the inside of the opening 17 and the SiON film 13 by sputtering, and an electrode pad 19 formed out of Cu of 3 μm in thickness and a TiW film 21 of 0.2 μm in thickness are formed on this barrier film 18 in this order by sputtering. At this time, the barrier film 18, the electrode pad 19 and the TiW film 21 are formed in a stepped shape 27 being along the faces of the metal wiring layer 15, the SiO2 film 12 and the SiON film 13.

Next, a photoresist film 20 is formed to 2.3 μm in thickness as a mask on the TiW film 21 and a part of the TiW film 21 projecting from the edge of the photoresist film 20 is etched away by means of an etching solution containing $H_2O_2$ and $H_2O$ at a ratio of "1:2". Further, a part of the electrode pad 19 projecting from the edge of the photoresist film 20 is etched away by means of an etching solution containing $H_2SO_4$, $H_2O_2$ and $H_2O$ at a ratio of "1:2". Following this, a part of the barrier film 18 projecting from the edge of the photoresist film 20 is etched away by means of an etching solution containing $H_2O_2$ and $H_2O$ at a ratio of "1:2". After this, the photoresist film 20 is removed.

Figure 14:
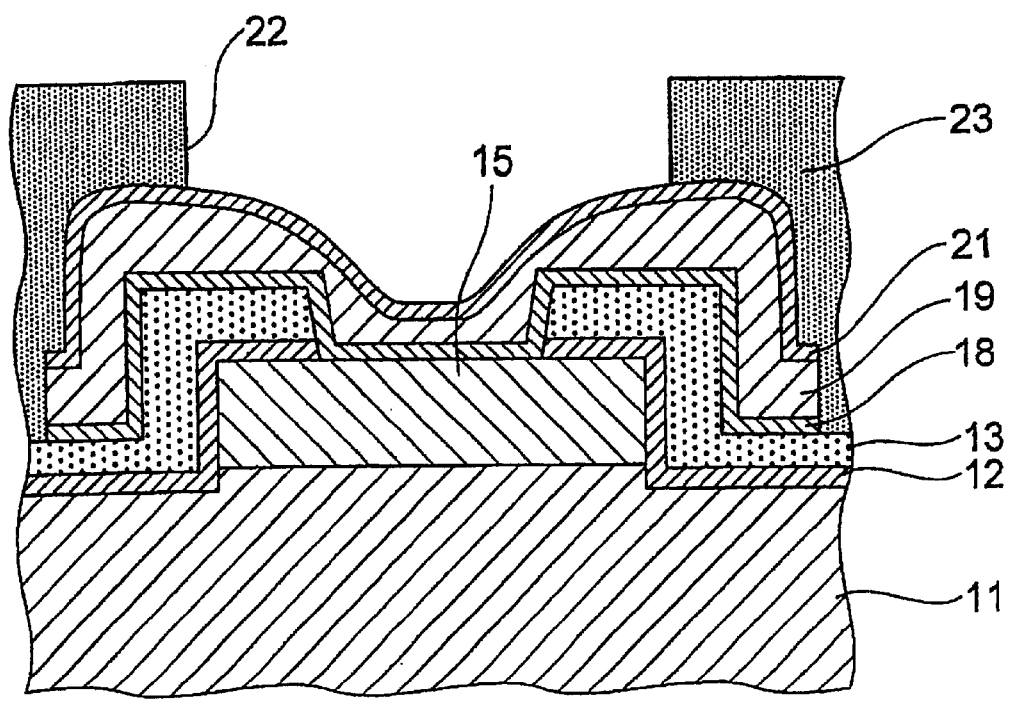
FIG. 14 is a sectional view showing in order the processes of manufacturing the semiconductor device in the third embodiment.

Next, as shown in FIG. 14, a polyimide film 23 having photosensitivity is formed to 10 μm in thickness so as to cover the outer edge portion of the TiW film 21, the electrode pad 19, the barrier film 18 and an exposed surface of the SiON film 13, and this polyimide film 23 is exposed to a specified pattern and developed and there by an opening 22 having a specified size is formed in a specified part of this polyimide film 23 and the central part of the TiW film 21 is exposed from this opening 22. Further, the polyimide film 23 is baked at a temperature of 380° C. for 30 minutes.

Figure 15:
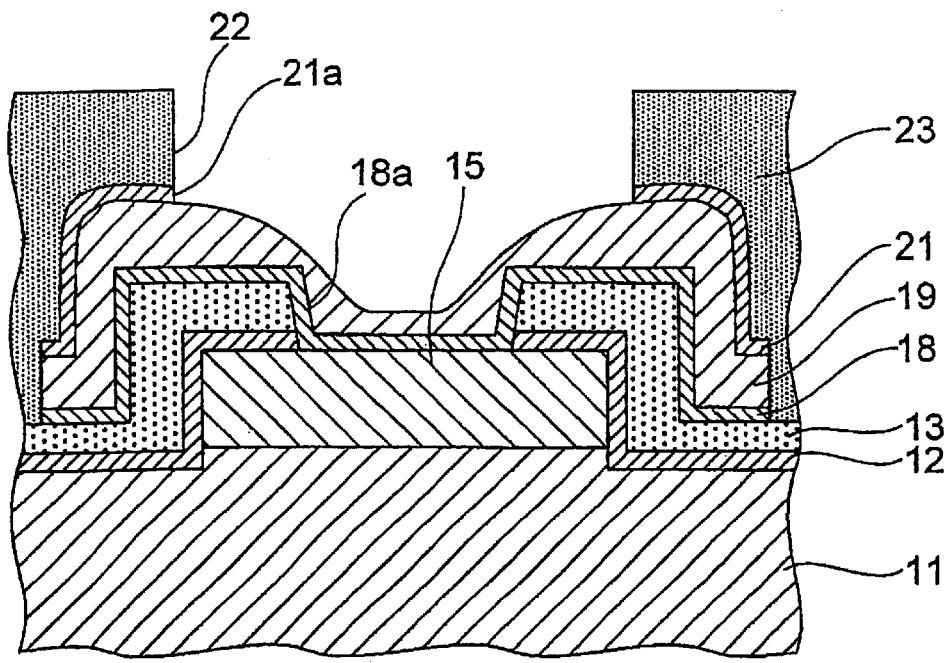
FIG. 15 is a sectional view showing in order the processes of manufacturing the semiconductor device in the third embodiment.

Moreover, the TiW film 21 inside the opening 22 is wet-etched by means of an etching solution containing $H_2O_2$ and $H_2O$ at a ratio of "1:2", and thereby an opening 21a in the same shape as the opening 22 is formed as shown in FIG. 15, and the electrode pad 19 is exposed from this opening 21a. By this, a sidewall composed of the polyimide film 23 around the opening 22 and the TiW film 21 around the opening 21a is formed on the end face of the boundary between the electrode pad 19 and the barrier film 18.

The adhesion of the polyimide film 23 to the electrode pad 19 is enhanced by forming the TiW film 21 between the polyimide film 23 and the electrode pad 19, and thereby the diffusion of an Sn component to the boundary between the electrode pad 19 and the barrier film 23 can be effectively prevented and the invasion of moisture and the like can be also prevented.

Next, electric characteristics of a plurality of LSIs arranged on a single wafer are tested by a die sorting test and after the test has ended, each LSI is cut out from the wafer so as to be a semiconductor chip.

Figure 16:
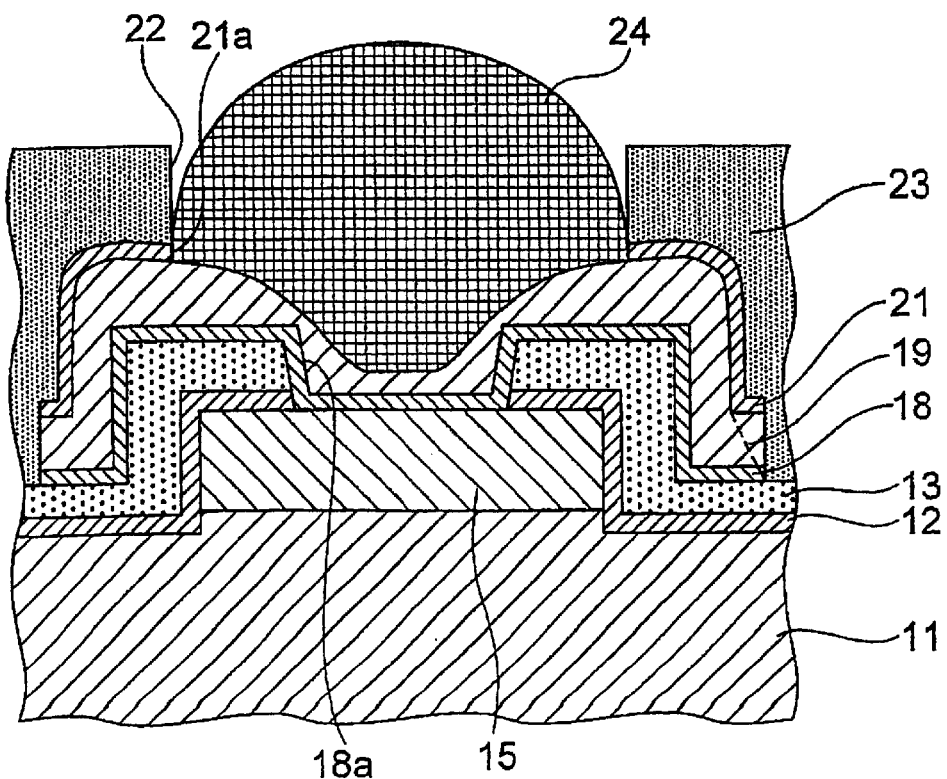
FIG. 16 is a sectional view showing in order the processes of manufacturing the semiconductor device in the third embodiment.

Moreover, as shown in FIG. 16, a solder bar 24 formed out of a high-melting point solder of Pb-Sn is melted and adhered onto the electrode pad 19 exposed in the openings 22 and 21a, and is reflowed for 10 minutes at a temperature of 340 to 365° C. At the time of this reflow, while the diffusion of the Sn component is suppressed by the sidewalls (21 and 23) around the electrode pad 19, the high-melting point solder of Pb-Sn is formed to a solder ball having a size of 150 μm in diameter by surface tension on the electrode pad 19.

Figure 17:
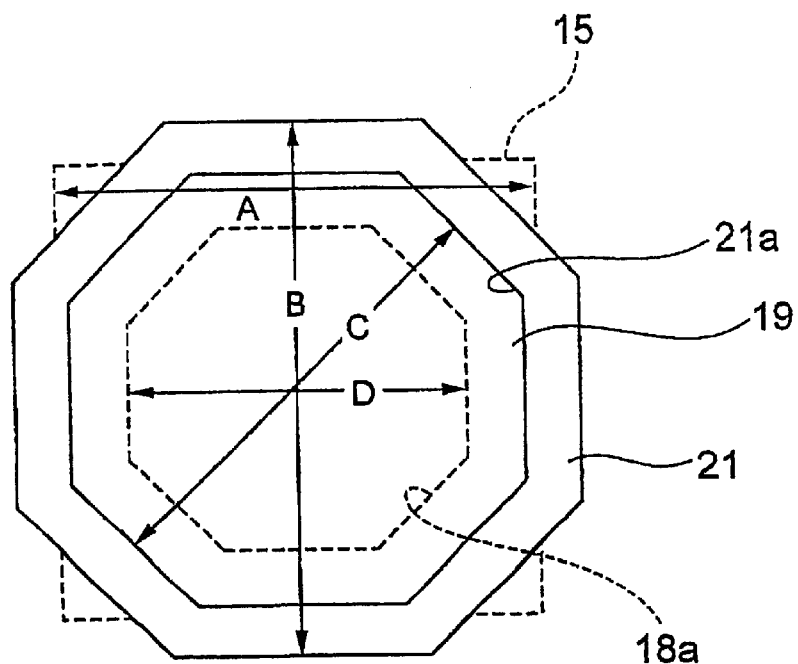
FIG. 17 ia plan view of the semiconductor device shown in FIG. 15.

FIG. 17 is a plan view schematically showing the semiconductor device shown in FIG. 15, in which a solder ball forming portion is illustrated being magnified in particular. In this Figure, the TiW film 21 and the electrode pad 19 (barrier film 18) each are formed in the shape of a regular octagon. The metal wiring layer 15 is set at 140±10 μm in width A, the distance B between two sides opposite to each other of the TiW film 21 is set at 155±10μm, the distance C between two sides opposite to each other of the opening 21a is set at 135±10μm, and the distance D between two sides opposite to each other of the opening 18a is set at 90±10μm.

Here, the distance C is properly determined according to the size of a solder ball, and the distance D is properly determined according to the holding strength of the solder ball. And the distance A is set so as to be at least larger than the distance D by an allowable error in consideration of the accuracy of aligning the opening 17 with the electrode pad 19 in an LSI manufacturing process (FIG. 12). Similarly, the distance B is set so as to be at least larger than the distance C by an allowable error so that the end face of the electrode pad 19 is securely covered with the polyimide film 23 in consideration of the accuracy of aligning the photosensitive polyimide film 23 with the electrode pad 19 for exposure in an LSI manufacturing process. And the shape of the electrode pad 19, the opening 17 and the barrier film 21 is not limited to a regular octagon but may be such a shape as a regular polygon or a circle which can prevent a solder ball from coming to be liable to exfoliate due to concentration of a stress at a corner of a polygon.

Figure 18:
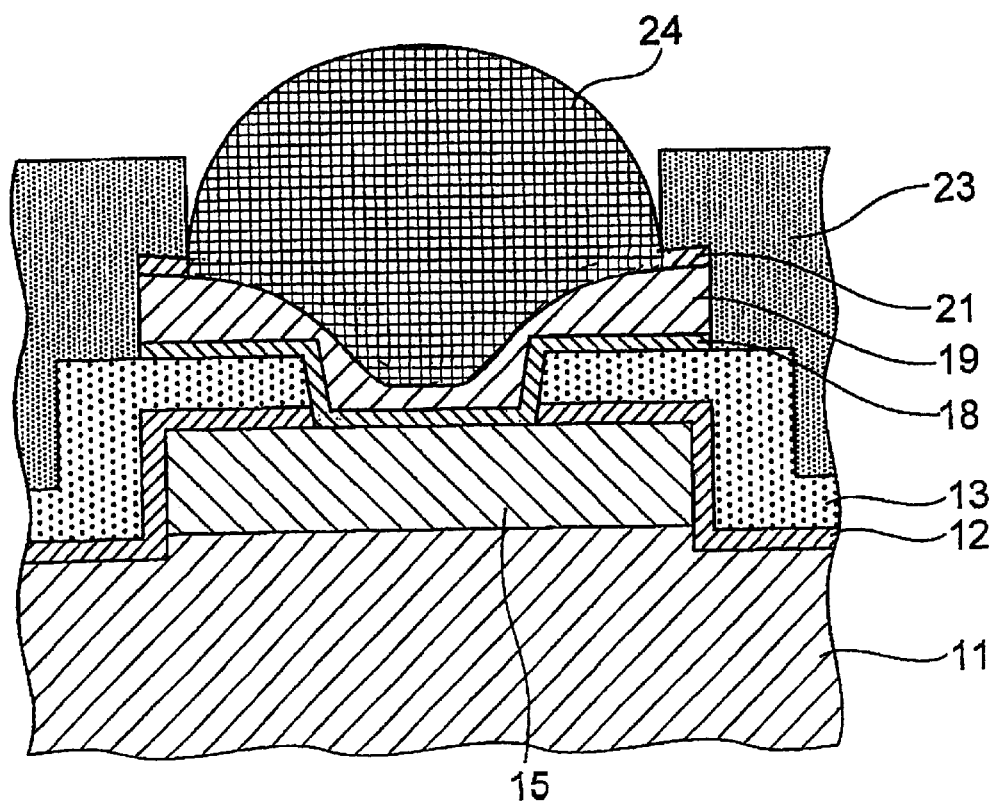
FIG. 18 is a sectional view showing a variation example of the semiconductor device of the third embodiment.

And in case that the plane-shaped metal wiring layer 15 can be formed large in size, as shown in FIG. 18, the end face of the electrode pad 19 may be located so as to be on the upper face of the SiON film 13 without forming a step at the outer edge portion of the electrode pad 19.

According to this embodiment, since the Sn component of a solder ball 24 does not diffuse from the end face to the boundary between the electrode pad 19 and the barrier film 18 thanks to the presence of the sidewalls (21 and 23), it is possible to obtain the same action and effect as the first embodiment. Further, even in case that for example a range of 5 to 10 μm of the outer edge portion of an electrode pad 19 is formed in a tapered shape as shown by a dashed line of FIG. 16, since the outer edge (end face) of the boundary between the electrode pad 19 and the barrier film 18 is completely covered with a polyimide film 23, the diffusion of an Sn component to said boundary is more securely prevented.

In the first to third embodiments of the present invention, the metal wiring layer 15 is of a 1-layer structure formed out of aluminum, copper or the like, but the metal wiring layer 15 is not limited to this but can be of a layered structure. This layered structure can be formed out of, for example, titanium nitride (TiN), AlCu, Ti and TiN in order from an insulating film 11 side.

And in order to prevent solder from being alloyed due to contact of a solder layer (24) with a copper layer (19) or prevent an Sn component from diffusing, it is conceivable to put a nickel layer between these two layers. In the first to third embodiments, however, no nickel layer exists on the barrier film 18, but the electrode pad 19 of copper is made thicker by a portion equivalent to the nickel layer. This intends to save such processes as sputtering, etching and the like necessary for forming a nickel layer and save an equipment investment. For example, in case of forming a nickel layer, there is the possibility that nickel is adhered to the reverse surface of a wafer or other places and causes deterioration of a finished transistor, but each embodiment of the present invention solves such a problem by forming no nickel layer.

The present invention has been described above on the basis of the preferred embodiments, and a semiconductor device and a method for manufacturing the same according to the present invention are not limited to the above-mentioned embodiments but semiconductor devices and their manufacturing methods obtained by applying various modifications and variations to the above-mentioned embodiments are included in the scope of the present invention. For example, the above embodiments have shown examples where an electrode pad 19 is formed on a wafer and then a die sorting test is performed and the wafer is divided into semiconductor chips and thereafter a solder ball is melted and adhered onto each chip, but it is possible also to melt and adhere a solder ball in a state where it is on a wafer and perform a die sorting test and thereafter divide the wafer into semiconductor chips.

As described above, according to a semiconductor device and its manufacturing method of the present invention, it is possible to prevent exfoliation of an electrode pad from a barrier film, improve the manufacturing yield rate, and improve the reliability of connection of a semiconductor device to a wiring board, even if a strain caused by the difference in thermal expansion coefficient between the semiconductor device and the wiring board occurs.

The present invention is not limited by the embodiments and it is obvious that it is capable of modifying the embodiments properly within the spirit and the scope of the present invention.

What is claimed is:

1. A semiconductor device comprising:
   a barrier film;
   an electrode pad directly contacting said barrier film and having a peripheral edge defining an outer face of said electrode pad;
   a solder ball directly contacting said electrode pad; and
   a side wall film surrounding said peripheral edge of said electrode pad in contact with said peripheral edge of said electrode pad and with said barrier film, said solder ball being spaced from a boundary between said barrier film and said electrode pad, wherein said side wall film comprises the same material as said barrier film to prevent said electrode pad from separating from said barrier film.

2. The semiconductor device as claimed in claim 1, wherein said side wall film covers said boundary between said barrier film and said electrode pad.

3. The semiconductor device as claimed in claim 1, wherein said solder ball is good in wettability with said electrode pad and is poor in wettability with said barrier film and said side wall film.

4. The semiconductor device as claimed in claim 1, wherein said material is TiW.

5. A semiconductor device comprising:
   a wiring layer;
   an insulating layer on said wiring layer;
   an opening selectively formed in said insulating layer to expose a part of said wiring layer;

a barrier film formed in contact with said part of said wiring layer and extending over said insulating layer;

an electrode pad formed on said barrier film and having an edge surface defining an outer shape of said electrode pad;

a side wall film formed along said edge surface of said electrode pad; and a solder ball formed on said electrode pad and being separated from said edge surface of said electrode pad by said side wall, wherein said side wall film comprises the same material as said barrier film to prevent said electrode pad from separating from said barrier film.

6. The semiconductor device as claimed in claims 5, wherein said electrode pad has a tapered edge.

7. A semiconductor device comprising:

a wiring layer;

an insulating layer on said wiring layer;

an opening formed in said insulating layer to expose an upper surface of said wiring layer;

a barrier film formed on an inner surface of said opening and on said insulating layer;

an electrode pad formed on said barrier film;

a side wall film formed on a s de surface of said barrier film and on a side surface of said electrode pad, said side wall film covering a boundary between said barrier film and said electrode pad; and a solder ball formed on said electrode pad, wherein said solder ball is good in wettability with said electrode pad and is poor in wettability with said barrier film and said side wall film, wherein said side wall film comprises the same material as said barrier film to prevent said electrode pad from separating from said barrier film.

8. The semiconductor device as claimed in claim 7, wherein said solder ball comprises Sn, said electrode pad comprises Cu, and said barrier film comprises Ti.

9. The semiconductor device as claimed in claim 7, wherein said material is TiW.

10. The semiconductor device as claimed in claim 7, wherein said side wall film comprises a TiW film and a poyimide film.

11. The semiconductor device as claimed in claim 7, wherein said insulating layer comprises a $SiO_2$ film, a SiON film and a polyimide film.

12. A semiconductor device comprising:

a barrier film having an upper surface and a peripheral edge defining an outer shape of said barrier film;

an electrode pad formed on said upper surface of said barrier film and having an upper surface and a peripheral edge defining an outer shape of said electrode pad, said upper surface of said electrode pad having a center portion and a peripheral portion surrounding said center portion;

a solder ball formed on said center portion of said upper surface of said electrode pad;

a side wall film surrounding said peripheral edges of said barrier film and said electrode pad in contact with said peripheral edges of said barrier film and electrode pad and extending over said peripheral portion of said upper surface of said electrode pad, said solder ball being spaced from a boundary between said barrier film and said electrode pad to prevent said electrode pad from separating from said barrier film, and a second side wall film inserted between said side wall film and said peripheral portion of said upper surface of said electrode pad to enhance and adhesion therebetween.

13. The semiconductor device as claimed in claim 12, wherein said second side wall film inserted between said side wall film and said peripheral portion of said upper surface of said electrode pad comprises the same material as said barrier film.

14. A semiconductor device comprising:

a wiring layer;

an insulating layer on said wiring layer;

an opening selectively formed in said insulating layer to expose a par of said wiring layer;

a barrier film formed in contact with said part of said wiring layer and extending over said insulating layer and having an upper surface and a peripheral edge defining an outer shape of said barrier film;

an electrode pad formed on said upper surface of said barrier film and having an upper surface and a peripheral edge defining an outer shape of said electrode pad, said upper surface of said electrode pad having a center portion and a peripheral portion surrounding said center portion;

a side wall film formed along said peripheral edges of said barrier film and electrode pad and extending over said peripheral portion of said upper surface of said electrode pad to prevent said electrode pad from separating from said barrier film;

a solder ball formed on said center portion of said upper surface of said electrode pad and being separated from said peripheral edges of said barrier film and said electrode pad by said side wall; and a second side wall film inserted between said side wall film and said peripheral portion of said upper surface of said electrode pad to enhance an adhesion therebetween.

15. The semiconductor device as claimed in claim 14, wherein said second side wall film inserted between said side wall film and said peripheral portion of said upper surface of said electrode pad comprises the same material as said barrier film.

* * * * *